United States Patent [19]
Watatani et al.

[11] Patent Number: 5,620,526
[45] Date of Patent: Apr. 15, 1997

[54] IN-SITU CLEANING OF PLASMA TREATMENT CHAMBER

[75] Inventors: Hirofumi Watatani; Masahiko Doki, both of Kawasaki; Shoji Okuda, Kasugai; Junya Nakahira; Hideaki Kikuchi, both of Kawasaki, all of Japan

[73] Assignees: Fujitsu Limited, Kanagawa; Fujitsu VLSI Limited, Aichi, both of Japan

[21] Appl. No.: 279,110

[22] Filed: Jul. 22, 1994

[30] Foreign Application Priority Data

Sep. 10, 1993 [JP] Japan ................................ 5-225547

[51] Int. Cl.⁶ .................................................. C09K 13/08
[52] U.S. Cl. .................... 134/1.1; 216/67; 216/79
[58] Field of Search ................. 156/646.1, 643.1, 156/345, 662.1; 118/723 MW; 134/1.1; 216/67, 79, 80

[56] References Cited

U.S. PATENT DOCUMENTS

| 4,811,684 | 3/1989 | Tashiro et al. | 118/723 |
| 4,960,488 | 10/1990 | Law et al. | 156/643 |
| 5,207,836 | 5/1993 | Chang | 156/643 |
| 5,211,796 | 5/1993 | Hansen | 156/643 |
| 5,286,297 | 2/1994 | Moslehi et al. | 156/643 |
| 5,326,723 | 7/1994 | Petro et al. | 437/192 |
| 5,356,478 | 10/1994 | Chen et al. | 156/643 |

FOREIGN PATENT DOCUMENTS 63-267430  11/1988  Japan.
4-214873  8/1992  Japan.

*Primary Examiner*—R. Bruce Breneman
*Assistant Examiner*—George Goudreau
*Attorney, Agent, or Firm*—Nikaido Marmelstein Murray & Oram LLP

[57] ABSTRACT

A cleaning of a plasma chamber is done by a $NF_3$ plasma treatment (typically under 1 to 1.5 Torr). The etching rate of an oxide layer can be improved by inserting, between the $NF_3$ plasma treatments, a low pressure (lower than $10^{-1}$ Torr) plasma treatment preferably in a plasma of oxygen, water vapor, silane, fluorine, a hydrate compound, nitrogen trifluoride, or a mixture of nitrogen trifluoride with at least one of hydrogen fluoride, fluorine, water vapor and hydride compounds.

10 Claims, 2 Drawing Sheets

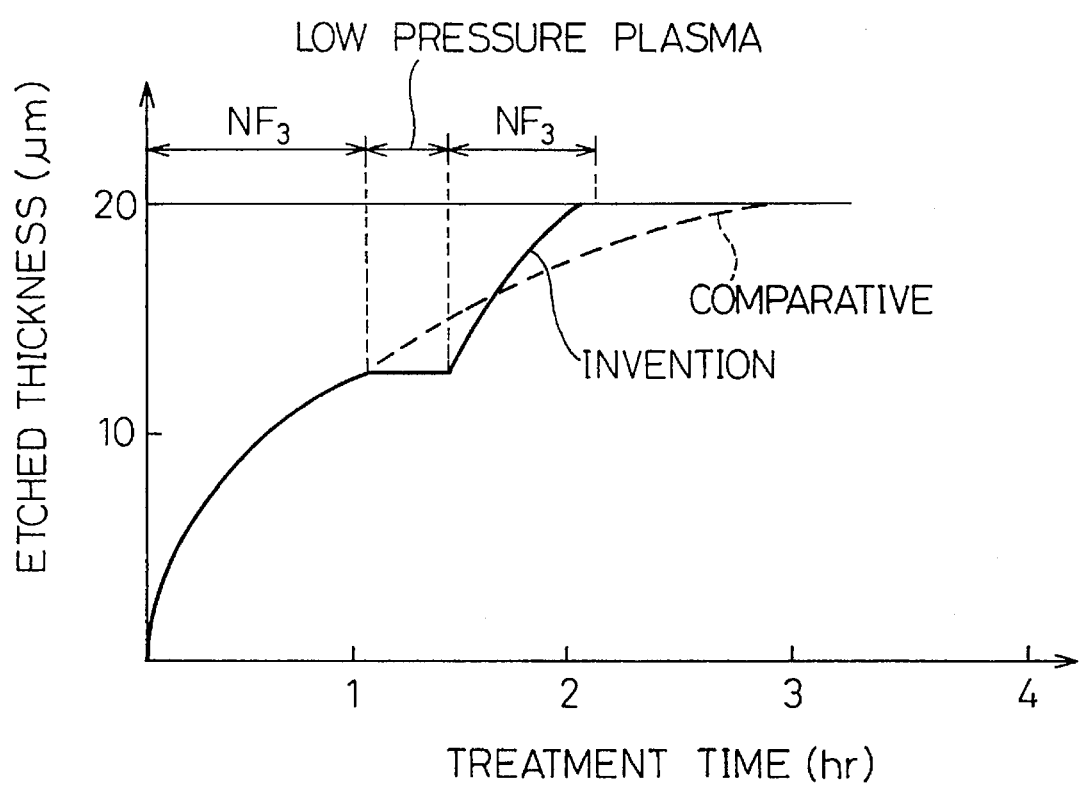

IN-SITU CLEANING OF PLASMA TREATMENT CHAMBER

BACKGROUND OF THE INVENTION

1. Field of the Invention

The present invention relates to a process for fabricating a semiconductor device, more specifically the process including the step of in-situ cleaning a plasma treatment chamber. For example, in fabrication of a semiconductor device such as an MOS or bipolar transistor, an oxide layer is clung onto the inner surface of a plasma CVD apparatus, and the oxide layer can be in-situ removed in the plasma reaction chamber at a high rate.

2. Description of the Related Art

Recently, fabrication of a semiconductor LSI often includes a process for depositing an oxide onto a wafer by plasma-enhanced CVD in a plasma reaction chamber.

Nevertheless, such plasma-enhanced CVD for depositing an oxide layer results in clinging an oxide onto the plasma reaction chamber, which oxide layer may be a cause to form particles during the later deposition and should be removed. This removal is done by wet or dry cleaning. The wet cleaning requires disassemble of the plasma reaction chamber and it takes a long time to completely remove the oxide layer by immersing the disassembled parts of the chamber. Accordingly, dry cleaning treatment has attracted attention since it allows a higher speed treatment. In such a dry cleaning process, $NF_3$, gas plasma treatment is utilized under the conditions of a pressure of 1 Torr, a power of 800 W and a microwave frequency of 2.45 GHz.

This dry cleaning treatment with $NF_3$ gas plasma still has a certain limitation in its cleaning speed depending on the rate of its chemical reaction and therefore can not comply with recent demands for a faster cleaning treatment.

The object of the present invention is therefore to provide a process for fabricating a semiconductor device in which an oxide layer clung inside a plasma treatment chamber during plasma CVD, etc. can be removed at a high rate.

SUMMARY OF THE INVENTION

In order to attain the above object, the present invention provides a process for fabricating a semiconductor device, said process including the steps of conducting a first plasma treatment in a plasma treatment chamber with nitrogen trifluoride plasma at a first pressure, so as to remove an oxide layer previously deposited inside the plasma treatment chamber, conducting a second plasma treatment in said plasma treatment chamber at a second pressure lower than said first pressure, and conducting a third plasma treatment in a plasma treatment chamber with nitrogen trifluoride plasma at a third pressure higher than said second pressure, so as to further remove said oxide layer.

The first pressure is typically in a range of 1 to 1.5 Torr. The second pressure is therefore preferably lower than $10^{-1}$ Torr, more preferably lower than $10^{-3}$ Torr.

The second plasma treatment may be conducted in a plasma of an inert gas such as argon, but preferably in a plasma of oxygen, water vapor, silane, fluorine, a hydrate compound, nitrogen trifluoride, or a mixture of nitrogen trifluoride with at least one of hydrogen fluoride, fluorine, water vapor and hydride compounds.

Also, it is preferable to use a plasma of a mixture of nitrogen trifluoride with fluorine in the first or third plasma treatment. The presence of fluorine plasma accelerates removal of an oxide layer by an increased amount of active fluorine.

If necessary, the first and second plasma treatments may be cyclically repeated.

BRIEF DESCRIPTION OF THE DRAWINGS

FIG. 2 shows the relationships between the thickness of the etched oxide layer and the etching time.

DESCRIPTION OF THE PREFERRED EMBODIMENTS

Figure 1:
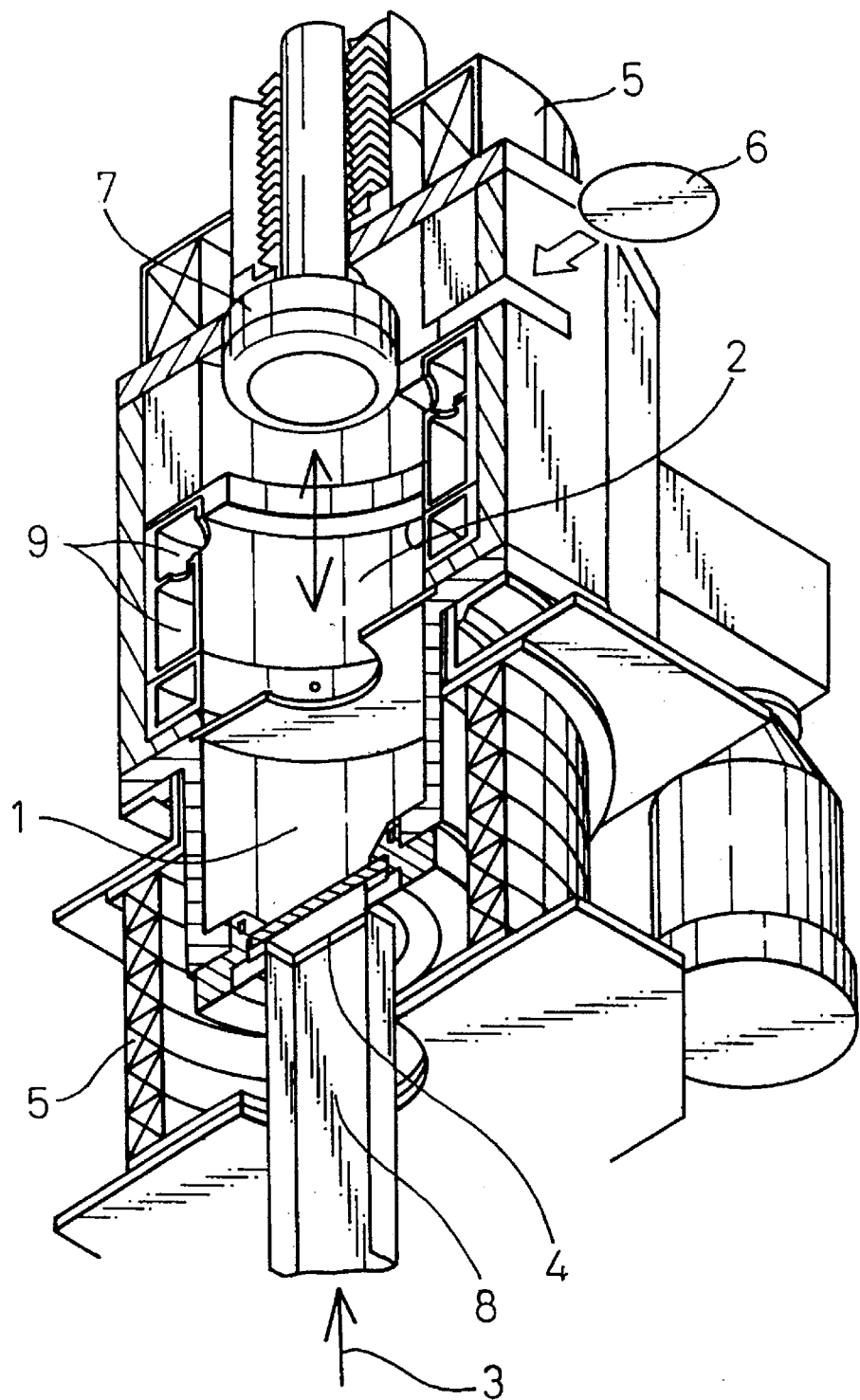
FIG. 1 is a schematic view of a microwave plasma CVD apparatus.

FIG. 1 schematically shows a microwave plasma CVD apparatus. This apparatus comprises a plasma chamber 1 in which ECR (Electron Cyclotron Resonance) plasma is generated and a reaction chamber 2 in which a reaction is conducted and accelerated. A microwave 3 is transmitted through a microwave introducing window 4 made of a transparent $Al_2O_3$ or AlN plate. The introduced microwave cooDerates with an ECR resonance magnetic field at 875 G applied by a magnetic coil 5 to generate plasma in the plasma chamber 1, which is transported in the direction of dispersion of the magnetic field to a substrate or wafer 6 fixed on an electrostatic chack 7 where a chemical reaction occurs to deposit a layer onto the substrate 6. In FIG. 1, 8 denotes a rectangular wave guide (taper type), 9 an exhaust, and 10 a magnet coil.

In a plasma treatment conducted in the above microwave plasma treatment apparatus, it is obviously preferable that the plasma treatment is conducted in an identical environment in order to suppress formation of particles and keep a process stable. To attain such an identical environment, plasma cleaning of the apparatus is conducted to remove an oxide or other layer deposited inside the apparatus in a previous deposition process. Microwave plasma is preferably used in such a cleaning because it does not harm or damage the apparatus. Particularly a plasma treatment with a plasma of nitrogen trifluoride is used to remove an oxide layer.

Nevertheless, when cleaning with nitrogen trifluoride plasma is conducted, it was found that the rate of cleaning or etching an oxide layer is retarded gradually and becomes very slow after a certain time period, so that the cleaning speed is limited. The inventors discovered that this lowering of the cleaning or etching rate can be recovered if a lower pressure plasma treatment preferably with a certain gas plasma is inserted between the above nitrogen trifluoride plasma treatment. The reasons for the lowering the cleaning or etching rate in a nitrogen trifluoride plasma treatment and for the recovering the rate by a lower pressure plasma treatment, particularly in a certain gas plasma, are not clear but considered as below.

When a nitrogen trifluoride plasma treatment is continued, $SiF_2$, $SiF_3$, etc. are deposited on the oxide layer so that the etching rate of the oxide layer decreases. The lower pressure plasma treatment, particularly in a certain gas plasma, removes the $SiF_2$, $SiF_3$, etc. deposited on the oxide layer and exposes the oxide layer. The low pressure plasma treatment cannot effectively remove the underlying oxide layer. But when a nitrogen trifluoride plasma treatment is again conducted, the exposed oxide layer can be etched or removed effectively, i.e., at a high rate. Therefore repetition of a high pressure nitrogen trifluoride plasma treatment and a lower pressure plasma treatment, particularly in a certain gas plasma, is very effective in cleaning a thick oxide layer clung to the apparatus.

EXAMPLES

In an ECR plasma apparatus as shown in FIG. 1, a 20 μm thick oxide layer which was previously deposited onto a substrate by a plasma-enhanced CVD oxide deposition was etched by nitrogen trifluoride ($NF_3$) plasma treatment. The conditions of the treatment were a pressure of 1 Torr, a power of 800 W, a microwave frequency of 2.45 GHz and a flow rate of $NF_3$ gas of 50 cc/min.

FIG. 2 shows the relationships between the thickness of the etched oxide layer and the etching time. The broken line is the result of the above comparative example treatment. FIG. 2 shows that the etching rate was lowered gradually and it took 180 minutes to etch the 20 μm thick oxide layer.

In contrast, in accordance with the present invention, a $NF_3$ plasma treatment under the same conditions as in the above comparative example was conducted and, then, a low pressure $O_2$ plasma treatment was conducted under the conditions of a pressure of 1 to 100 mTorr, a power of 300 W, a microwave frequency of 2.45 GHz and a flow rate of $O_2$ gas of 50 cc/min. After the low pressure $O_2$ plasma treatment a $NF_3$ plasma treatment under the same conditions as above was repeated. As a result, as shown by the solid line in FIG. 1, the 20 μm thick oxide layer could etched in 144 minutes, which is 20% reduction of the treatment time in comparison with the comparative example.

The time period for the first $NF_3$ plasma treatment was 67 minutes, that for the low pressure $O_2$ plasma treatment was 10 minutes, and that for the second $NF_3$ plasma treatment was 67 minute. As shown in FIG. 1, the etching rate of the oxide layer by a $NF_3$ plasma treatment was recovered or increased after the low pressure $O_2$ plasma treatment when compared with when only the $NF_3$ plasma treatment continued.

In the above treatment, an $O_2$ plasma treatment was used for the low pressure plasma treatment, but other low pressure plasma treatments were also effective including the treatment using a plasma of $H_2O$, $SiH_4$, $NF_3$, Ar, $F_2$ or the like. In a low pressure plasma treatment, the acceleration energy increases so that chemicals such as $SiF_3$ adhered onto the surface of the chamber are physically removed. However, if the low pressure treatment is carried out with a plasma of $NF_3$, the plasma region of the $NF_3$ plasma is expanded so that the chamber can be cleaned to every nook and corner. If the low pressure treatment is carried out with a plasma of $SiH_4$, chemicals adhered onto the surface of the chamber can be chemically removed.

The high and low pressure plasma treatments as above may be cylcically repeated.

An introduction of fluorine during $NF_3$ plasma treatment increases the etching rate.

We claim:

1. A process for in-situ cleaning of a plasma treatment chamber, said process comprising the steps of:

conducting a first plasma treatment in a plasma treatment chamber with nitrogen trifluoride plasma at a first pressure, so as to remove an oxide layer previously deposited inside the plasma treatment chamber;

conducting a second plasma treatment in said plasma treatment chamber at a second pressure lower than said first pressure, said second plasma treating being conducted in a plasma of a gas selected from a group consisting of oxygen, water vapor, silane, fluorine, nitrogen trifluoride, or a mixture of nitrogen trifluoride with at least one of hydrogen fluoride, fluorine, and water vapor; and a third plasma treatment in said plasma treatment chamber with nitrogen trifluoride plasma at a third pressure higher than said second pressure, so as to further remove said oxide layer.

2. A process according to claim 1, wherein said second pressure is lower than $10^{-1}$ Torr.

3. A process according to claim 1, wherein said second pressure is lower than $10^{-3}$ Torr.

4. A process according to claim 1, wherein said second plasma treatment is conducted in an oxygen plasma.

5. A process according to claim 1, wherein said second plasma treatment is conducted in a plasma of nitrogen trifluoride.

6. A process according to claim 1, wherein said second plasma treatment is conducted in a plasma of silane.

7. A process according to claim 1, wherein said first and/or third plasma treatments are conducted in a plasma of a mixture of nitrogen trifluoride and fluorine.

8. A process according to claim 1, wherein said third plasma treatment is conducted under the same conditions as those of said first plasma treatment and said first and second plasma treatments are cyclically repeated.

9. A process according to claim 1, wherein said plasma chamber is a microwave plasma chamber.

10. A process according to claim 1, wherein said first pressure is in a range of 1 to 1.5 Torr.

* * * * *